United States Patent
Jun

(10) Patent No.: US 8,860,115 B2
(45) Date of Patent: Oct. 14, 2014

(54) CAPACITORS AND SEMICONDUCTOR DEVICES INCLUDING THE SAME

(71) Applicant: Samsung Electronics Co., Ltd., Gyeonggi-do (KR)

(72) Inventor: Jong-Ryul Jun, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/796,552

(22) Filed: Mar. 12, 2013

(65) Prior Publication Data

US 2013/0277724 A1 Oct. 24, 2013

(30) Foreign Application Priority Data

Apr. 19, 2012 (KR) .................. 10-2012-0041004

(51) Int. Cl.
| | | |
|---|---|---|
| H01G 4/01 | (2006.01) | |
| H01L 27/108 | (2006.01) | |
| H01G 4/012 | (2006.01) | |
| H01G 4/33 | (2006.01) | |
| H01L 49/02 | (2006.01) | |
| H01G 4/228 | (2006.01) | |
| H01G 4/40 | (2006.01) | |

(52) U.S. Cl.
CPC ................ *H01G 4/40* (2013.01); *H01G 4/012* (2013.01); *H01G 4/33* (2013.01); *H01L 28/90* (2013.01); *H01G 4/228* (2013.01)
USPC ............................ 257/307; 257/309; 257/534

(58) Field of Classification Search
USPC ................................. 257/306, 308, 309, 534
See application file for complete search history.

(56) References Cited

U.S. PATENT DOCUMENTS

| | | | |
|---|---|---|---|
| 7,573,121 B2 | 8/2009 | Yates et al. | |
| 2004/0245560 A1* | 12/2004 | Pontoh et al. | ................. 257/309 |
| 2005/0001952 A1 | 1/2005 | Han et al. | |
| 2006/0126142 A1 | 6/2006 | Choi | |
| 2006/0181902 A1 | 8/2006 | Tamura et al. | |
| 2006/0268568 A1 | 11/2006 | Oku et al. | |
| 2007/0008739 A1 | 1/2007 | Kim et al. | |
| 2007/0284641 A1* | 12/2007 | Seo | ............................. 257/304 |
| 2008/0002428 A1 | 1/2008 | Byun et al. | |

FOREIGN PATENT DOCUMENTS

| | | |
|---|---|---|
| JP | 2005-103825 A | 4/2005 |
| JP | 2006-209076 A | 8/2006 |
| JP | 2008-235072 A | 10/2008 |
| JP | 2009-117272 A | 5/2009 |
| KR | 10-2006-0075931 A | 7/2006 |
| KR | 10-0772777 B1 | 10/2007 |
| KR | 10-2007-0108991 A | 11/2007 |
| KR | 10-2008-0106650 A | 12/2008 |
| KR | 10-2009-0093610 A | 9/2009 |
| KR | 10-2010-0122656 A | 11/2010 |

* cited by examiner

*Primary Examiner* — Daniel Shook
(74) *Attorney, Agent, or Firm* — Lee & Morse, P.C.

(57) ABSTRACT

A capacitor includes a lower electrode having a curved surface, a first seed on a sidewall of the lower electrode, which the first seed includes a metal silicide and has a shape corresponding to the curved surface of the lower electrode, a dielectric layer on the lower electrode, the dielectric layer covering the first seed, and an upper electrode on the dielectric layer.

11 Claims, 10 Drawing Sheets

CAPACITORS AND SEMICONDUCTOR DEVICES INCLUDING THE SAME

CROSS-REFERENCE TO RELATED APPLICATION

This application claims priority under 35 USC §119 to Korean Patent Application No. 10-2012-0041004 filed on Apr. 19, 2012 in the Korean Intellectual Property Office, and entitled: "Capacitors, Semiconductor Devices Including the Same, Methods of Forming Capacitor, and Methods of Manufacturing Semiconductor Device Using the Same," which is incorporated herein by reference in its entirety.

BACKGROUND

In highly integrated semiconductor devices, it may be difficult to increase the area of a lower electrode of a capacitor for obtaining high capacitance.

SUMMARY

According to example embodiments, there is provided a capacitor including a lower electrode, a first seed, a dielectric layer and an upper electrode. The lower electrode has a curved surface. The first seed is disposed on a sidewall of the lower electrode. The first seed includes a metal silicide and has a shape corresponding to the curved surface of the lower electrode. The dielectric layer is disposed on the lower electrode. The dielectric layer covers the first seed. The upper electrode is disposed on the dielectric layer.

In example embodiments, the first seed may have a grain shape.

In example embodiments, the capacitor may further include a substrate on which the lower electrode is formed, an insulating interlayer between the substrate and the lower electrode and a plug disposed through the insulating interlayer to electrically connect the substrate and the lower electrode.

In example embodiments, the capacitor may further include a second seed between the plug and the lower electrode, and the second seed may include a metal silicide and have a grain shape.

In example embodiments, the capacitor may further include a seed layer pattern between the plug and the lower electrode.

According to example embodiments, there is provided a method of forming a capacitor. In the method, a sacrificial layer having an opening is formed on a substrate. A seed is formed on an inner wall of the opening. A lower electrode is formed on the inner wall of the opening in such a manner that the lower electrode covers the seed and has a curved surface corresponding to a shape of the seed. The sacrificial layer is removed. A dielectric layer and an upper electrode are sequentially formed on the lower electrode and the seed.

In example embodiments, forming the seed may include forming a seed layer on the inner wall of the opening, and the seed may be formed as a result of reaction between the seed layer and the sacrificial layer.

In example embodiments, forming the seed layer may be performed using a titanium source gas or a cobalt source gas.

In example embodiments, forming the seed layer may be performed through a chemical vapor deposition (CVD) process or an atomic layer deposition (ALD) process, and a size and a composition of the seed may be controlled by varying process conditions of the CVD or ALD process.

In example embodiments, the sacrificial layer may include amorphous silicon, doped amorphous silicon, polysilicon or doped polysilicon.

In example embodiments, the lower electrode may have a cylindrical shape.

In example embodiments, the lower electrode may have a pillar shape.

According to example embodiments, there is provided a semiconductor device including a transistor, a plug, a lower electrode, a first seed, a dielectric layer and an upper electrode. The transistor includes a gate structure and an impurity region. The gate structure is disposed on a substrate and the impurity region is disposed at an upper portion of the substrate adjacent to the gate structure. The plug is electrically connected to the impurity region through an insulating interlayer. The insulating interlayer is disposed on the substrate to cover the transistor. The lower electrode having a curved surface is disposed on the plug. The first seed is disposed on a sidewall of the lower electrode. The first seed includes a metal silicide and has a shape corresponding to the curved surface of the lower electrode. The dielectric layer is disposed on the lower electrode. The dielectric layer covers the first seed. The upper electrode is disposed on the dielectric layer.

In example embodiments, the semiconductor device may further include a second seed between the plug and the lower electrode. The second seed may include a metal silicide and has a grain shape.

According to example embodiments, there is provided a method of manufacturing a semiconductor device. In the method, a transistor is formed on a substrate. The transistor includes a gate structure and an impurity region. An insulting interlayer is formed on the substrate in a manner such that the insulating interlayer accommodates a plug electrically connected to the impurity region and covers the transistor. A sacrificial layer is formed on the plug and the insulating interlayer. An opening is formed through the sacrificial layer to partially expose the substrate. A seed is formed on an inner wall of the opening. A lower electrode is formed on the inner wall of the opening in such a manner that the lower electrode covers the seed and has a curved surface corresponding to a shape of the seed. The sacrificial layer is removed. A dielectric layer and an upper electrode are sequentially formed on the lower electrode and the seed.

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE EMBODIMENTS

Figure 1:
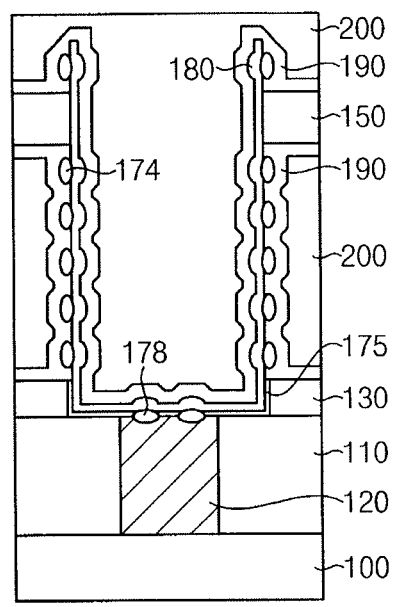
FIG. 1 illustrates a sectional view of a capacitor in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. Like reference numerals refer to like elements throughout. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a sectional view of a capacitor in accordance with example embodiments.

Referring to FIG. 1, the capacitor may include a lower electrode 180, first and second seeds 174 and 178, a dielectric layer 190, and an upper electrode 200. The capacitor may further include a seed layer pattern 175 and a support layer 150. The lower electrode 180 may be disposed on a plug 120 penetrating an insulating interlayer 110 that is formed on a substrate 100.

The substrate 100 may include, e.g., a silicon substrate, a germanium substrate, a silicon-germanium substrate, a silicon-on-insulator (SOI) substrate, or a germanium-on-insulator (GOI) substrate. The substrate 100 may be doped with an n-type and/or p-type dopant.

The insulating interlayer 110 may include, e.g., a silicon oxide such as borophosphosilicate glass (BPSG), undoped silicate glass (USG), and spin on glass (SOG). The plug 120 may include conductive polysilicon, doped polysilicon, or metals. The plug 120 may be electrically connected to an impurity region (not shown) of the substrate 100, and the lower electrode 180 may be electrically connected to the impurity region through the plug 120.

An etch stop layer 130 may be disposed on the insulating interlayer 110. The etch stop layer 130 may include an opening (not shown) through which at least a portion of the insulating interlayer 110 and the plug 120 are exposed.

The lower electrode 180 may be disposed on the plug 120 and on the portion of the insulating interlayer 110 that is exposed through the opening of the etch stop layer 130. For example, the lower electrode 180 may extend to overlap an entirety of the plug 120 and to overlap a portion of the insulating interlayer 110 enclosing the plug 120.

In example embodiments, the lower electrode 180 may have a cylindrical shape. However, embodiments are not limited thereto, e.g., the lower electrode 180 may have another shape such as a pyramidal shape. The bottom side of the lower electrode 180, e.g., of the cylindrical shape, may be formed on the plug 120 and the portion of the insulating interlayer 110 exposed through the opening. The sidewall of the lower electrode 180, e.g., of the cylindrical shape, may extend in a direction substantially perpendicular to the bottom side of the lower electrode 180 having, e.g., the cylindrical shape.

The second seeds 178 may be disposed between the topside of the plug 120 and the bottom side of the lower electrode 180. Since the second seeds 178 are disposed between the lower electrode 180 and the plug 120, the contact resistance between the lower electrode 180 and the plug 120 may be decreased. Accordingly to an exemplary embodiment, any seeds, e.g., specifically the second seeds 178, may be excluded from being arranged between the portion of the insulating interlayer 110 exposed through the opening and the lower electrode 180.

In example embodiments, a plurality of second seeds 178 having a grain shape may be formed, and the bottom side of the lower electrode 180 may be partially hemispheric according to the shape of the second seeds 178. For example, the bottom side of the lower electrode 180 may have protrusions, e.g., hemispheric protrusions, corresponding to the second seeds 178, in which the protrusions extend upwardly from the plug 120. Accordingly, the bottom side of the lower electrode 180 may be non-level, bumpy, and/or uneven to account for the second seeds 178 thereunder. The upper surface of the plug 120 may be substantially flat so that lower electrode 180 may be formed to have a wavy pattern including flat portions and curved portions based on the placement of the second seeds 178.

The first seeds 174 may be disposed on the sidewall of the lower electrode 180. For example, the first seeds 174 may be disposed on the outer wall of the lower electrode 180, which outer wall of the lower electrode 180 may face the upper electrode 200. Hereinafter, the outer wall surface of the lower electrode 180 will be referred to as a first surface, and the inner wall surface of the lower electrode 180 will be referred to as a second surface.

The first and second seeds 174 and 178 may be formed on the first surface of the lower electrode 180. Any seeds, e.g., specifically the first and second seeds 174 and 178, may be excluded from being arranged between the lower electrode 180 and the etch stop layer 130 and between the lower electrode 180 and the support layer 150. In example embodiments, a plurality of first seeds 174 having a grain shape like the second seeds 178 may be formed, and the sidewall of the lower electrode 180 may be partially hemispheric according to the shape of the first seeds 174. For example, the sidewall of the lower electrode 180 may have protrusions, e.g., hemispheric protrusions, corresponding to the first seeds 174. Accordingly, the bottom side of the lower electrode 180 may be non-level, bumpy, uneven, and/or wavy to account for the first seeds 174.

The first and second seeds 174 and 178 may include a metal silicide. For example, the first and second seeds 174 and 178 may include a same metal silicide. In example embodiments, the first and second seeds 174 and 178 may include, e.g., titanium silicide or cobalt silicide. The first and second seeds 174 and 178 may have a three-dimensional ellipse, sphere, or hemisphere shape. For example, at least one surface and/or both opposite surfaces of the first and second seeds 174 and 178 may be curved. The lower electrode 180 and the dielectric layer 190 may be in contact with opposing curved surfaces of the first seeds 174. The lower electrode 180 and the plug 120 may be in contract with opposing curved surfaces of the second seeds 178.

For example, the lower electrode 180 may include at least one of a metal such as copper, aluminum, tungsten, platinum, rubidium, and iridium, or at least one of a metal nitride such as titanium nitride, tantalum nitride, cobalt nitride and tungsten nitride. In example embodiments, the lower electrode 180 may include titanium nitride or cobalt nitride.

Since the lower electrode 180 has curved surfaces such as hemispheric surfaces according to the shapes of the first and second seeds 174 and 178, the surface area of the lower electrode 180 may be increased as compared with the case where the lower electrode 180 has flat surfaces. Therefore, the capacitance of the capacitor including the lower electrode 180 may be increased.

The seed layer pattern 175 may be disposed among the first surface of the lower electrode 180 and the plug 120, and the portion of the insulating interlayer 110 that are both exposed through the opening of the etch stop layer 130. Further, the seed layer pattern 175 may further be disposed on the sidewall of the opening. In example embodiments, the seed layer pattern 175 may include substantially the same metal as that is included in the first and second seeds 174 and 178. In example embodiments, the seed layer pattern 175 may include titanium or cobalt. In other exemplary embodiments, unlike in FIG. 7, the seed layer pattern 175 may be omitted.

The support layer 150 may make contact with the lower electrode 180. For example, the support layer 150 may make contact with the first surface of the lower electrode 180 to support the lower electrode 180. Accordingly, any seeds, e.g., the first and second seeds 174 and 178, may be excluded from being arranged between the support layer 150 and the lower electrode 180.

The dielectric layer 190 may be disposed on the lower electrode 180, the support layer 150, and the etch stop layer 130 to surround the first seeds 174. As described above, since the first seeds 174 have a grain shape and the second surface of the lower electrode 180 is curved according to the shape of the first seeds 174, the dielectric layer 190 formed on the first seeds 174 and the lower electrode 180 may be also curved according to the shape of the first seeds 174. For example, the dielectric layer 190 may be partially hemispheric and/or may have a bumpy and uneven surface due to protrusions formed on a surface thereof. Therefore, the dielectric layer 190 may have a large surface area as compared with the case where the dielectric layer 190 has flat surfaces. Accordingly, the capacitor including the dielectric layer 190 may have a large capacitance.

The dielectric layer 190 may include a silicon nitride or a high-k material having a dielectric constant greater than that of a silicon nitride. Examples of the high-k material may include tantalum oxide, hafnium oxide, aluminum oxide, and zirconium oxide.

The upper electrode 200 may be disposed on the dielectric layer 190. For example, the upper electrode 200 may include at least one of a metal such as copper, aluminum, tungsten, platinum, rubidium, and iridium, or a metal nitride such as titanium nitride, tantalum nitride, and tungsten nitride.

In the example embodiments, the capacitor includes the first and second seeds 174 and 178, and the lower electrode 180 and the dielectric layer 190 may have curved surfaces corresponding to the shapes of the first and second seeds 174 and 178. The upper electrode 200 may have projections thereon, e.g., so as to have a rough surface, that correspond to the curved surface of the dielectric layer 190. Accordingly, at least the lower electrode 180 and the dielectric layer 190 may have large surface areas as compared with the case where the lower electrode 180 and the dielectric layer 190 have flat surfaces, and thus the capacitance of the capacitor may be increased.

FIGS. 2 to 8 illustrate sectional views for explaining a method of forming a capacitor in accordance with example embodiments.

Figure 2:
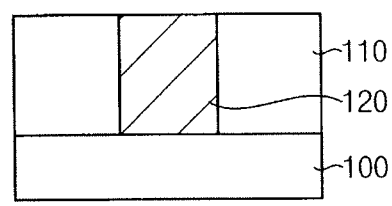
FIGS. 2 to 8 illustrate sectional views depicting stages in a method of forming a capacitor in accordance with example embodiments.

Referring to FIG. 2, an insulating interlayer 110 and a plug 120 penetrating the insulating interlayer 110 are formed on the substrate 100.

The substrate 100 may include, e.g., a silicon substrate, a germanium substrate, a silicon-germanium substrate, an SOI substrate, or a GOI substrate. The substrate 100 may be doped with an n-type and/or p-type dopant.

The insulating interlayer 110 may be formed using a silicon oxide. For example, the insulating interlayer 110 may include a silicon oxide such as at least one selected from the group of PBSG, USG, and SOG. The insulating interlayer 110 may be formed through a chemical vapor deposition (CVD) process or a physical vapor deposition (PVD) process.

The plug 120 may be made by forming a hole (not shown) through the insulating interlayer 110 to expose the substrate 100, forming a conductive layer on the substrate 100 and the insulating interlayer 110 to fill the hole, and then planarizing an upper portion of the conductive layer. The conductive layer may be formed using, e.g., doped polysilicon and metal through a CVD process, a PVD process, or an atomic layer deposition (ALD) process. The planarizing process may be performed until an upper surface of the insulating interlayer 110 is exposed. For example, the planarizing process may include a chemical mechanical polishing (CMP) process and/or an etch-back process.

Figure 3:
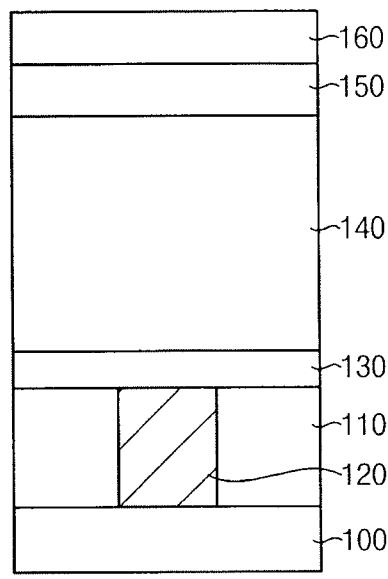

Referring to FIG. 3, an etch stop layer 130, a first sacrificial layer 140, a support layer 150, and a second sacrificial layer 160 may be sequentially formed on the insulating interlayer 110 and the plug 120.

The etch stop layer 130 may be formed on the insulating interlayer 110 and the plug 120 through a CVD process, a PVD process, or an ALD process. The etch stop layer 130 may be used as an etch stop structure when an opening 165 (refer to FIG. 4) is formed in a later process. In some example embodiments, the etch stop layer 130 may be omitted.

The first sacrificial layer 140 may be formed on the etch stop layer 130 through a CVD process or a PVD process by using a material such as amorphous silicon, doped amorphous silicon, polysilicon, doped polysilicon, germanium, or doped germanium.

The support layer 150 may be formed on the first sacrificial layer 140 through a CVD process, a plasma-enhanced chemical vapor deposition (PECVD), or a low-pressure chemical vapor deposition (LPCVD) by using a material such as silicon nitride, silicon carbide, silicon carbonitride, or silicon oxynitride. Although not shown in FIG. 3, the support layer 150 may be partially etched to form a support layer pattern. The support layer 150 may support a capacitor to be formed later. In some example embodiments, the support layer 150 may not be formed.

The second sacrificial layer 160 may be formed on the support layer 150 through a CVD process or a PVD process by using a material such as amorphous silicon, doped amorphous silicon, polysilicon, doped polysilicon, germanium, or doped germanium.

Figure 4:
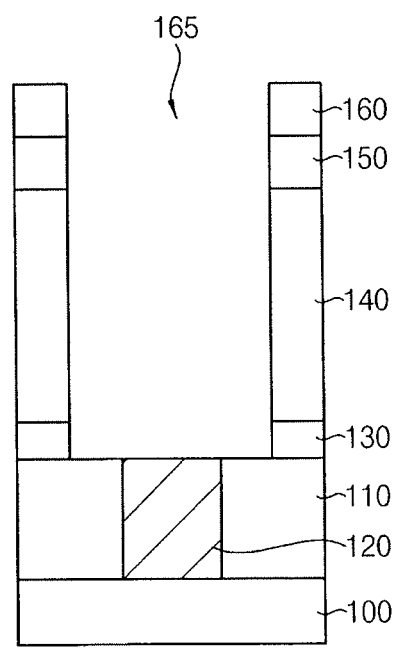

Referring to FIG. 4, an opening 165 may be formed by partially removing the second sacrificial layer 160, the support layer 150, the first sacrificial layer 140, and the etch stop layer 130, so as to expose the plug 120 and the insulating interlayer 110.

The opening 165 may be formed through a dry etch process using a photoresist pattern (not shown). In example embodiments, the first sacrificial layer 140 and the second sacrificial layer 160 may be partially removed through an etch process using an etch gas such as HF, HBr, $CF_4$, $C_2F_6$, $CHF_3$, $CH_2F_2$, $CH_3Br$, $CClF_3$, $CBrF_3$, $CCl_4$, $SF_6$, $Cl_2$, HBr, or $NF_3$. The etch stop layer 130 and the support layer 150 may be partially removed through an etch process using an etch gas such as $CH_3F$, $CHF_3$, $CF_4$, $C_2F_6$, or $NF_3$. Since the first sacrificial layer 140 and the second sacrificial layer 160 may include polysilicon or doped polysilicon instead of oxide, a vertical wall may be formed around the opening 165. According to another exemplary embodiment, the first and second sacrificial layers 140 and 160 may be partially removed through a wet etch process using an etchant such as a hydrofluoric acid solution, a solution including $NH_4OH$, KOH, or NaOH, or a buffered oxide etch (BOE).

Figure 5:
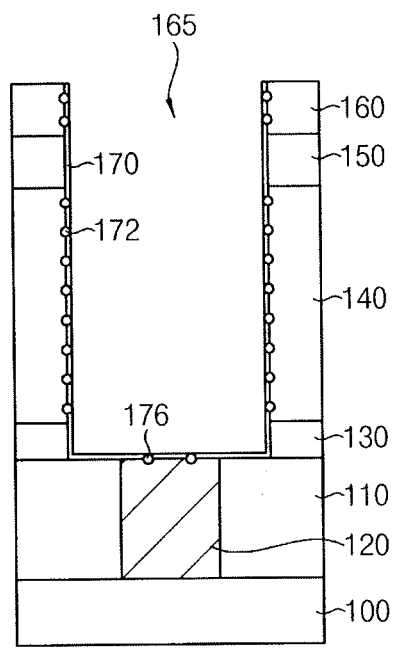

Referring to FIG. 5, preliminary seeds 172 and 176 and a seed layer 170 may be foamed on the inner wall of the opening 165.

The seed layer 170 may be formed through a deposition process such as a CVD process or an ALD process, and during the deposition process, the preliminary seeds 172 and 176 may be formed through a reaction between the seed layer 170 and the first and second sacrificial layers 140 and 160. In example embodiments, the seed layer 170 may be formed of a titanium source gas including $TiCl_4$, $Ti(OiPr)_4$, $Ti(OtBu)_4$, or $Ti(OCH(CH_3)_2)_4$(TTIP). In other example embodiments, the seed layer 170 may be formed using a cobalt source gas including $Co_2(CO)_6$(HC≡CtBu), $Co_2(CO)_6$(HC≡CPh), $Co_2(CO)_6$(HC≡CH), $Co_2(CO)_6$(HC≡CCH$_3$), or $Co_2(CO)_6$($CH_3$C≡CCH$_3$).

The thickness of the seed layer 170, and the composition, size, and shape of the preliminary seeds 172 and 176 may be controlled by adjusting process conditions of the deposition process such as deposition time and temperature. For example, if the seed layer 170 is formed of a titanium source gas, the seed layer 170 may include titanium, and the preliminary seeds 172 and 176 may include a titanium-silicon compound (TiSix) produced as a result of a reaction between titanium included in the titanium source gas and silicon included in the first sacrificial layer 140. As the process time of the deposition time increases, the concentration of titanium in the titanium-silicon compound ($TiSi_x$) may increase, and the size of the preliminary seeds 172 and 176 may increase. In this way, the composition, size, and shape of the preliminary seeds 172 and 176 may be controlled. Although not shown in FIG. 4, if the deposition process is performed for a time period shorter than a predetermined process time, the seed layer 170 may not be formed on the inner wall of the opening 165.

In example embodiment, an impurity source gas may be further used in the deposition process so that the preliminary seeds 172 and 176 may include an impurity. For example, when the seed layer 170 is formed of a titanium source and/or a cobalt source gas, an impurity source gas such as diborane ($B_2H_6$) or phosphine ($PH_3$) may also be used so that the preliminary seeds 172 and 176 may include an impurity. According to another exemplary embodiment, after the seed layer 170 and the preliminary seeds 172 and 176 are formed, the preliminary seeds 172 and 176 may be doped with an impurity by using a source gas of such an impurity.

The preliminary seeds 172 and 176 may be referred to as first preliminary seeds 172 and second preliminary seeds 176 according to positions thereof. That is, the first preliminary seeds 172 may be formed on the sidewall of the opening 165, and the second preliminary seeds 176 may be formed on the bottom side of the opening 165.

Figure 6:
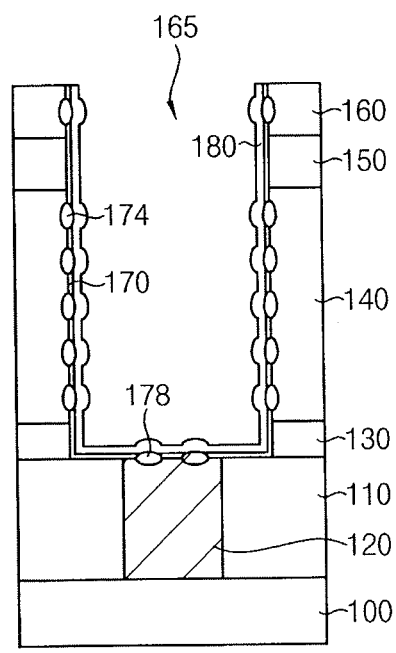

Referring to FIG. 6, a lower electrode 180 may be formed in the opening 165 to cover the seed layer 170 and the seeds 174 and 178.

The lower electrode 180 may be formed at a temperature higher than the temperature at which the seed layer 170 and the preliminary seeds 172 and 176 are formed. While the lower electrode 180 is formed, titanium or cobalt included in the seed layer 170 may react with silicon atoms of the first sacrificial layer 140 to form a titanium-silicon compound or a cobalt-silicon compound, and accordingly the size of the preliminary seeds 172 and 176 may be increased. That is, when the lower electrode 180 is formed, the preliminary seeds 172 may be increased in size to become first seeds 174, and the preliminary seeds 176 may be increased in size to become second seeds 178.

The seed layer 170, the first seeds 174, and/or the second seeds 178 may function as a wetting layer or barrier layer. In other words, the second seeds 178 may be disposed between the lower electrode 180 and the plug 120, and may reduce the contact resistance between the lower electrode 180 and the plug 120. In addition, the seed layer 170 and the first seeds 174 may be disposed on the sidewall of the first sacrificial layer 140 and function as a barrier layer reducing the possibility of and/or preventing constitutional elements of the lower electrode 180 from diffusing into the first sacrificial layer 140. When the lower electrode 180 is formed by a deposition process, the seed layer 170, the first seeds 174, and the second seeds 178 may function as a wetting layer so that initial deposition on the surfaces thereof may be easily carried out.

The lower electrode 180 may be formed by, e.g., forming a lower electrode layer on the inner wall of the opening 165 and the second sacrificial layer 160 to cover the seed layer 170 and the preliminary seeds 172 and 176, and planarizing an upper portion of the lower electrode layer. In example embodiments, the lower electrode layer may include a metal or a metal nitride. For example, the lower electrode 180 may include a metal such as copper, aluminum, tungsten, platinum, rubidium, and iridium, or a metal nitride such as titanium nitride, tantalum nitride, and tungsten nitride. The planarizing process may be performed until the second sacrificial layer 160 is exposed. For example, the planarizing process may include a CMP process and/or an etch-back process.

Since the lower electrode 180 is formed on the first and second seeds 174 and 178, the lower electrode 180 may have a curved surface according to the shapes of the first and second seeds 174 and 178. For example, the lower electrode 180 may have surfaces hemispherically patterned corresponding to the shapes of the first and second seeds 174 and 178. Accordingly, the surface area of the lower electrode 180 may be increased as compared with the case where the lower electrode 180 has flat surfaces.

In example embodiments, the first and second seeds 174 and 178 may not be removed. In this case, the sidewall of the first sacrificial layer 140 may have a large surface area, and the contact resistance between the plug 120 and the lower electrode 180 may be reduced. Since the first and second seeds 174 and 178 are not removed through an additional process, the method of forming a capacitor may be simplified.

Figure 7:
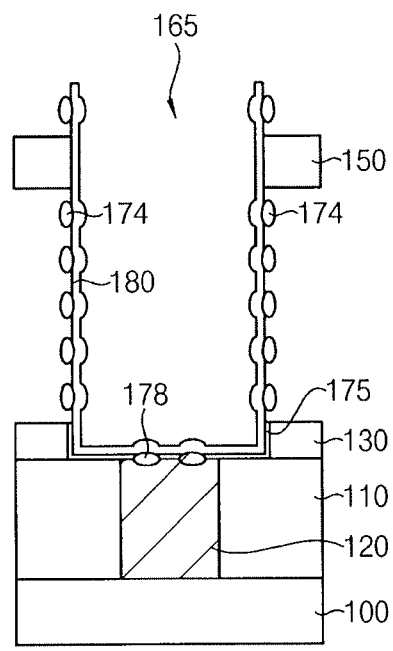

Referring to FIG. 7, the first sacrificial layer 140 and the second sacrificial layer 160 are removed.

In example embodiments, the first and second sacrificial layers 140 and 160 may be removed through a wet etch process using a solution including, e.g., ammonia. At this time, a portion of the seed layer 170 formed on the sidewall of the opening 165 may also be removed. Further, portions of the seed layer 170 formed on the top surfaces of the plug 120 and the insulating interlayer 110, and formed on the sidewall of the etch stop layer 130, may remain as a seed layer pattern 175.

Figure 8:
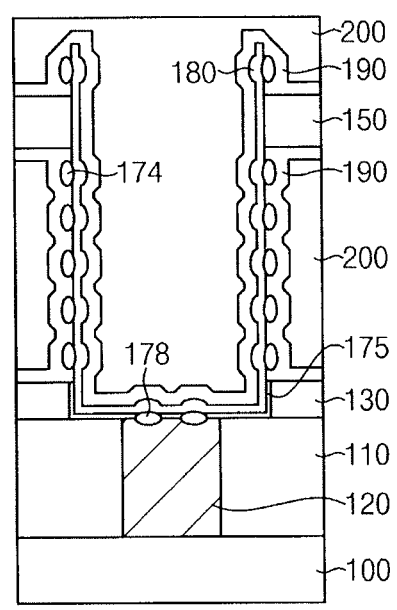

Referring to FIG. 8, a dielectric layer 190 and an upper electrode 200 may be sequentially formed on the first seeds 174, the lower electrode 180, the support layer 150, and the etch stop layer 130.

The dielectric layer 190 may include a silicon nitride or a high-k material having a dielectric constant greater than that of a silicon nitride. Examples of the high-k material may include tantalum oxide, hafnium oxide, aluminum oxide, and zirconium oxide. The high-k material may include one or a combination of the listed oxides. The dielectric layer 190 may be formed through a process such as a CVD process, a PVD process, or an ALD process.

The dielectric layer 190 may be formed on the lower electrode 180 and the first and second seeds 174 and 178 and thus have a curved surface according to the shapes of the lower electrode 180 and the first and second seeds 174 and 178. For example, the dielectric layer 190 may have surfaces hemispherically patterned, e.g., forming protrusions thereon, corresponding to the shapes of the lower electrode 180 and the first and second seeds 174 and 178. Accordingly, the surface area of the dielectric layer 190 may be increased as compared with the case where the dielectric layer 190 has flat surfaces.

Thereafter, the upper electrode 200 may be formed of a metal, a metal nitride, or doped polysilicon through a process such as a CVD process, a PVD process, or an ALD process. Unlike in FIG. 8, the upper electrode 200 may be formed on the dielectric layer 190 in the form of a thin film.

According to the method of the example embodiments, a capacitor having a large surface area may be formed, owing to the first and second seeds 174 and 178. Since the first seeds 174 are not removed, the surface area of the lower electrode 180 may not be reduced in a process of removing the first seeds 174, and thus the method of forming a capacitor may be simple. The first and second seeds 174 and 178 may function as a wetting layer or barrier layer when the lower electrode 180 is formed, and a capacitor having a desired shape and electrical characteristics may be formed by adjusting the size, shape, and composition of the first and second seeds 174 and 178.

Figure 9:
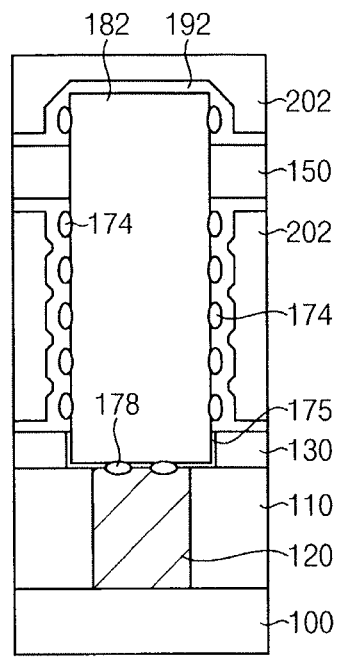
FIG. 9 illustrates a sectional view of a capacitor in accordance with example embodiments.

FIG. 9 illustrates a sectional view illustrating a capacitor in accordance with example embodiments.

Referring to FIG. 9, the capacitor may include a lower electrode 182, a dielectric layer 192, an upper electrode 202, and first and second seeds 174 and 178. The capacitor may further include a seed layer pattern 175 and a support layer 150.

The lower electrode 182 may be disposed on a plug 120 penetrating an insulating interlayer 110 formed on a substrate 100.

The substrate 100, the insulating interlayer 110, and an etch stop layer 130 are substantially similar to or the same as the substrate 100, the insulating interlayer 110, and the etch stop layer 130 described with reference to FIG. 1, and thus detailed descriptions thereof will not be repeated.

The substrate 100 may include a semiconductor substrate or a substrate including a semiconductor. The insulating interlayer 110 may be disposed on the substrate 100 and may include a silicon oxide. The plug 120 may be disposed through the insulating interlayer 110 and may include conductive polysilicon or metal. The etch stop layer 130 may be disposed on the insulating interlayer 110 and may include an opening (not shown) through which at least a portion of the insulating interlayer 110 and the plug 120 are exposed.

The lower electrode 182 may be disposed on the plug 120 and the portion of the insulating interlayer 110 that are exposed through the opening.

In example embodiments, the lower electrode 182 may have a pillar shape, and the pillar shape may extend in a direction substantially perpendicular to the substrate 100. The second seeds 178 may be disposed between the topside of the plug 120 and the bottom side of the lower electrode 180. Since the second seeds 178 are disposed between the lower electrode 182 and the plug 120, the contact resistance between the lower electrode 182 and the plug 120 may be decreased.

In example embodiments, a plurality of second seeds 178 having a grain shape may be formed, and the bottom side of the lower electrode 182 may be partially curved according to the shape of the second seeds 178.

The first seeds 174 may be disposed on the sidewall of the lower electrode 182. In example embodiments, a plurality of first seeds 174 having a grain shape like the second seeds 178 may be formed, and the sidewall of the lower electrode 182 may be partially curved according to the shape of the first seeds 174.

The first and second seeds 174 and 178 may include a metal silicide such as titanium silicide or a cobalt silicide. The first and second seeds 174 and 178 may have a three-dimensional ellipse, sphere, or hemisphere shape. For example, at least one surface and/or both opposite surfaces of the first and second seeds 174 and 178 may be curved.

The lower electrode 182 may include a metal or a metal nitride. In example embodiments, the lower electrode 182 may include titanium nitride or cobalt nitride.

Since the lower electrode 182 has curved surfaces such as hemispheric surfaces according to the shapes of the first and second seeds 174 and 178, the surface area of the lower electrode 182 may be large as compared with the case where the lower electrode 182 has flat surfaces. Therefore, the capacitance of the capacitor including the lower electrode 182 may be increased.

The seed layer pattern 175 may be disposed among the lower electrode 182, and the plug 120 and the portion of the insulating interlayer 110 that are exposed through the opening of the etch stop layer 130. Further, the seed layer pattern 175 may further be disposed on the sidewall of the opening. In example embodiments, the seed layer pattern 175 may include substantially the same metal as that included in the first and second seeds 174 and 178. Unlike in FIG. 7, the seed layer pattern 175 may not be formed so as to be omitted.

The support layer 150 may make contact with the lower electrode 182 and support the lower electrode 182.

The dielectric layer 192 may be disposed on the lower electrode 182, the support layer 150, and the etch stop layer 130 to surround the first seeds 174. As described above, since the first seeds 174 have a grain shape, the surface of the dielectric layer 192 formed on the first seeds 174 may have curved surfaces such as partial hemispheric surfaces. Therefore, the dielectric layer 192 may have a large surface area as compared with the case where the dielectric layer 192 has flat surfaces, and thus the capacitor including the dielectric layer 192 may have a large capacitance. The dielectric layer 192 may include a high-k material having a high dielectric constant such as tantalum oxide, hafnium oxide, aluminum oxide, zirconium oxide, a mixture thereof.

The upper electrode 202 may include a metal or metal nitride and may be disposed on the dielectric layer 192.

In the example embodiments, the capacitor includes the first and second seeds 174 and 178, and the lower electrode 182 and the dielectric layer 192 may have curved surfaces according to the shapes of the first and second seeds 174 and 178. Thus, the lower electrode 182 and the dielectric layer 192 may have large surface areas as compared with the case where the lower electrode 180 and the dielectric layer 190 have flat surfaces. Accordingly, the capacitance of the capacitor may be increased.

FIGS. 10 to 13 illustrate sectional views for explaining a method of forming a capacitor in accordance with other example embodiments.

Figure 10:
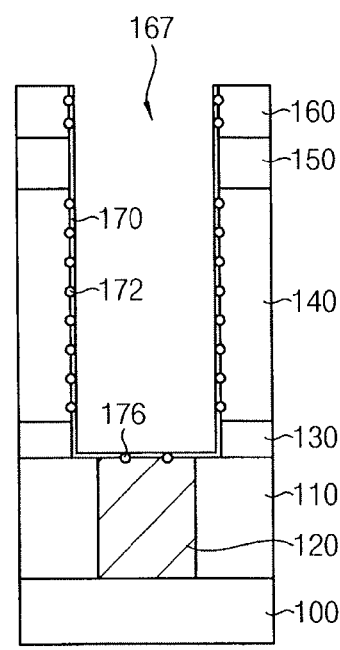
FIGS. 10 to 13 illustrate sectional views depicting stages in a method of forming a capacitor in accordance with example embodiments.

Referring to FIG. 10, substantially similar processes as those explained with reference to FIGS. 2 to 5 may be performed.

In example embodiments, an insulating interlayer 110 and a plug 120 may be formed on a substrate 100, and an etch stop layer 130, a first sacrificial layer 140, a support layer 150, and a second sacrificial layer 160 may be formed on the insulating interlayer 110 and the plug 120. Thereafter, the second sacrificial layer 160, the support layer 150, the first sacrificial layer 140, and the etch stop layer 130 may be partially removed to form an opening 167 through which the plug 120 is exposed, and first and second preliminary seeds 172 and 176 and a seed layer 170 may be formed on the inner wall of the opening 167. The opening 167 shown in FIG. 10 may be narrower than the opening 165 explained with reference to FIG. 5.

Figure 11:
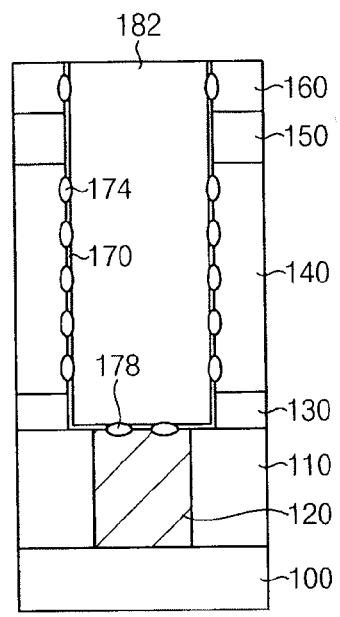

Referring to FIG. 11, a lower electrode 182 is formed in the opening 167 to cover the seed layer 170, and to cover the first and second seeds 174 and 178.

In example embodiments, the lower electrode 182 may be formed at a higher temperature than a temperature at which the seed layer 170 and the first and second preliminary seeds 172 and 176 are formed. When the lower electrode 182 is formed, titanium or cobalt included in the seed layer 170 may react with silicon atoms of the first sacrificial layer 140 to form a titanium-silicon or cobalt-silicon compound. Accordingly, the first preliminary seeds 172 may increase in size and become the first seeds 174, and the second preliminary seeds 176 may increase in size and become the second seeds 178.

The lower electrode 182 may be formed by, e.g., forming a lower electrode layer to cover the first and second preliminary seeds 172 and 176, fully filling the opening 167, and planarizing an upper portion of the lower electrode layer. Unlike the case of the lower electrode 180 explained with reference to FIG. 6, the lower electrode layer may be formed to completely fill the opening 167. The planarizing may be performed until an upper surface of the second sacrificial layer 160 is exposed. For example, the planarizing process may include a CMP process and/or an etch-back process.

Since the lower electrode 182 is formed on the first and second seeds 174 and 178, the lower electrode 180 may have a curved surface according to the shapes of the first and second seeds 174 and 178. For example, the lower electrode 182 may have surfaces hemispherically patterned corresponding to the shapes of the first and second seeds 174 and 178. Accordingly, the surface area of the lower electrode 182 may be increased as compared with the case where the lower electrode 182 has flat surfaces.

Figure 12:
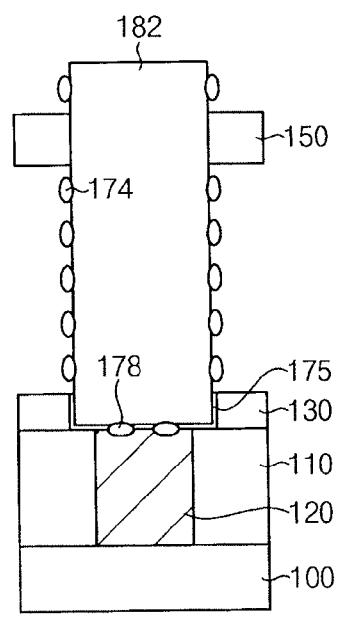

Referring to FIG. 12, the first sacrificial layer 140 and the second sacrificial layer 160 may be removed. In example embodiments, when the first and second sacrificial layers 140 and 160 are removed, a portion of the seed layer 170 formed on the sidewall of the opening 167 may also be removed, but portions of the seed layer 170 formed on the sidewall of the etch stop layer 130 and the top surfaces of the plug 120 and the insulating interlayer 110 may remain as a seed layer pattern 175.

Figure 13:
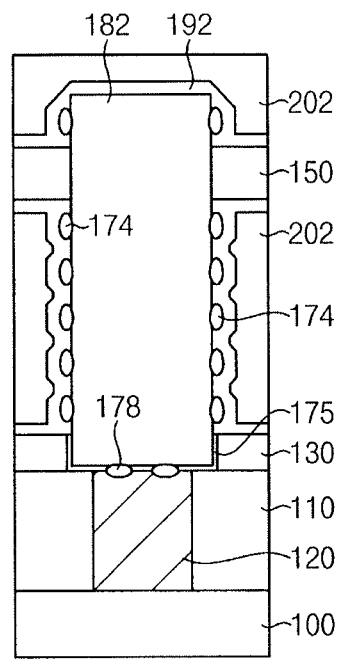

Referring to FIG. 13, a dielectric layer 192 and an upper electrode 202 may be sequentially formed on the first seeds 174, the lower electrode 182, the support layer 150, and the etch stop layer 130, thereby forming the capacitor. The upper electrode 202 may have a thin film shape.

According to the method of the example embodiments, a capacitor having a large surface area may be formed, owing to the first and second seeds 174 and 178. Since the first seeds 174 are not removed, the surface area of the lower electrode 182 may not be reduced in a process of removing the first seeds 174. Further, the method of forming a capacitor may be simplified.

Figure 14:
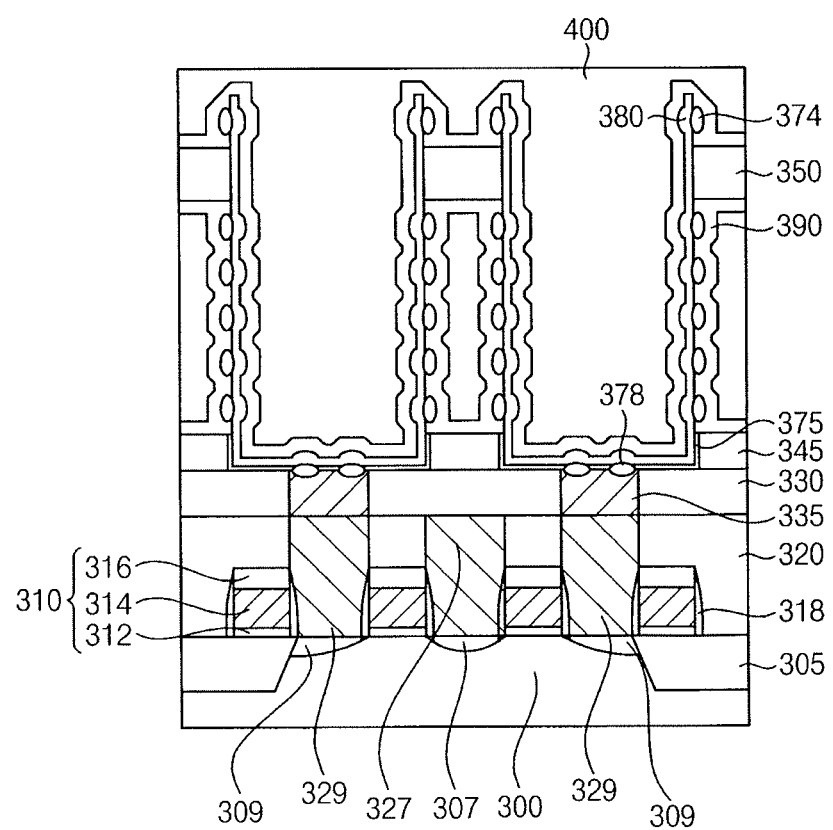
FIG. 14 illustrates a sectional view of a semiconductor device in accordance with example embodiments.

FIG. 14 illustrates a sectional view illustrating a semiconductor device in accordance with example embodiments.

The semiconductor device may include a plurality of gate structures 310 disposed on a substrate 300, and capacitors electrically connected to the gate structures 310. A plurality of insulating interlayers (first and second insulating layers 320 and 330) may be disposed on the substrate 300 to cover the gate structures 310. The capacitors may be disposed on the second insulating interlayer 330 and may be electrically connected to plugs (second and third plugs 329 and 335) formed through the insulating interlayers 320 and 330, respectively.

The gate structures 310 may be disposed on the substrate 300 on which an isolation layer 305 is formed. Each of the gate structures 310 may include a gate insulation layer pattern 312, a gate electrode 314, and a hard mask 316 that are sequentially stacked. The gate structures 310 may further include spacers 318 disposed on sidewalls thereof.

First and second impurity regions 307 and 309 may be located at an upper portion of the substrate 300 adjacent to the gate structures 310. The first and second impurity regions 307 and 309 may not overlap the gate structures 310, and may each include n-type or p-type impurities.

The first insulating interlayer 320 may be disposed on the substrate 300 to cover the gate structures 310. First and second plugs 327 and 329 may penetrate the first insulating interlayer 320, and may make contact with the first and second impurity regions 307 and 309, respectively. The second insulating interlayer 330 may be disposed on the first insulating interlayer 320, and the third plugs 335 may be electrically connected to the second plugs 329 through the second insulating interlayer 330.

The capacitors each including a lower electrode 380, a dielectric layer 390, an upper electrode 400, and first and second seeds 374 and 378 may be disposed on portions of the second insulating interlayer 330 and the third plugs 335. The capacitors may be substantially similar to or the same as the capacitor described with reference to FIG. 1, and thus descriptions thereof will not be repeated. That is, an etch stop layer 345, the support layer 350, the first seeds 374, the seed layer 375, the second seeds 378, the lower electrode 380, the dielectric layer 390, and the upper electrode 400 may be substantially similar to or the same as the etch stop layer 130, the support layer 150, the first seeds 174, the seed layer 175, the second seeds 178, the lower electrode 180, the dielectric layer 190, and the upper electrode 200, respectively, described with reference to FIG. 1. Thus, descriptions thereof will not be repeated.

In the semiconductor device of the example embodiment, the capacitor includes the first and second seeds 374 and 378, and the lower electrode 380 and the dielectric layer 390 may have curved surfaces according to the shapes of the first and second seeds 174 and 178. Further the upper electrode 400 may have a projections thereon corresponding to the curved surface of the dielectric layer 390. Accordingly, at least the lower electrode 380 and the dielectric layer 390 may have large surface areas as compared with the case where the lower electrode 380 and the dielectric layer 390 have flat surfaces, and thus the capacitance of the capacitor may be increased. Accordingly, the semiconductor device may have satisfactory electrical characteristics.

Figure 15:
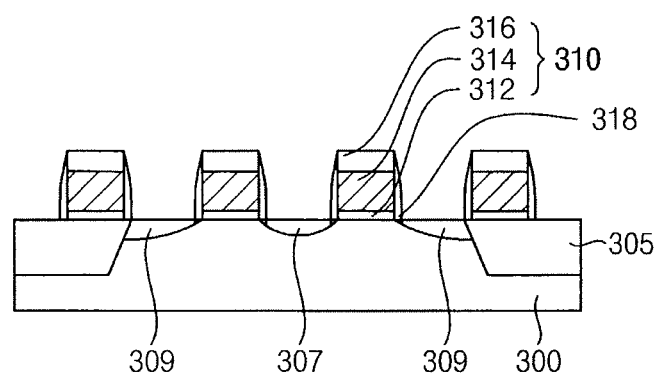
FIGS. 15 to 17 illustrate sectional views depicting stages in a method of manufacturing a semiconductor device in accordance with example embodiments.
Figure 16:
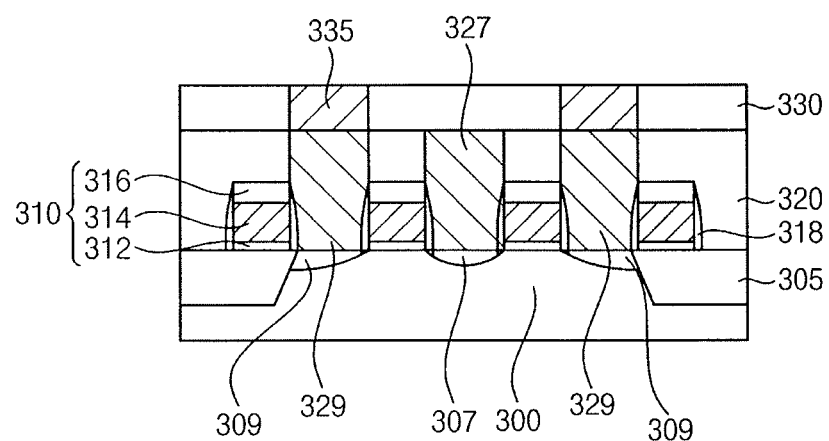
Figure 17:
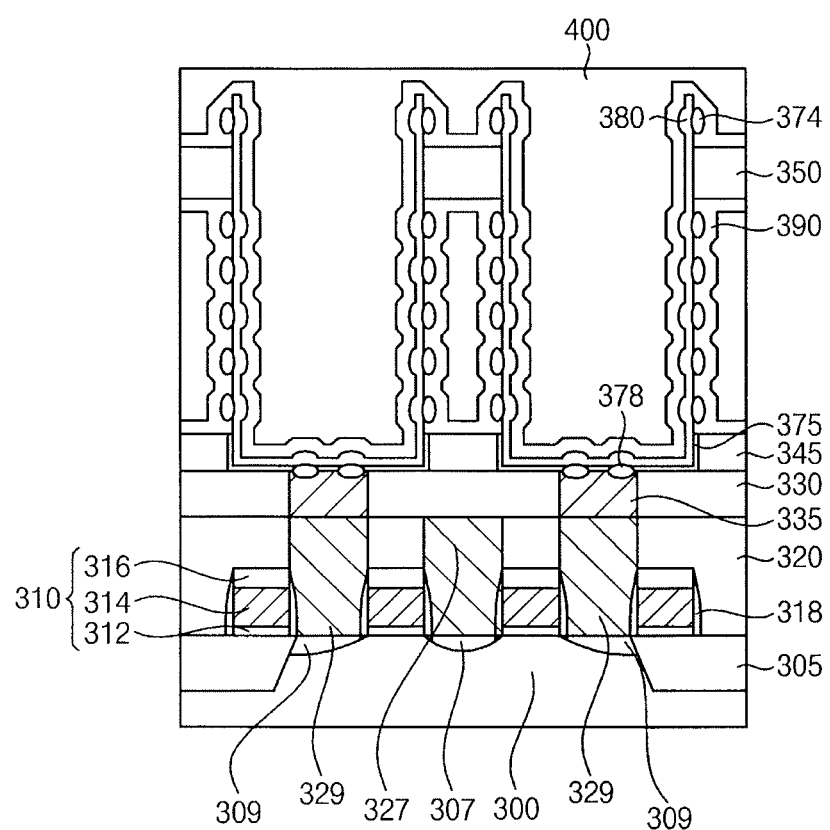

FIGS. 15 to 17 illustrate sectional views for explaining a method of manufacturing a semiconductor device in accordance with other example embodiments.

Referring to FIG. 15, an isolation layer 305, gate structures 310, and first and second impurity regions 307 and 309 are formed on a substrate 300.

The isolation layer 305 may be formed at an upper portion of the substrate 300. In example embodiments, the isolation layer 305 may be formed through a shallow trench isolation (STI) process.

A gate insulation layer, a gate electrode layer, and a hard mask layer may be sequentially formed on the substrate 300 and then, may be patterned through a photolithography process so as to form the gate structures 310, each including a gate insulation layer pattern 312, a gate electrode 314, and a hard mask 316 sequentially stacked on the substrate 300. The gate insulation layer may include silicon or a metal oxide. The gate electrode layer may include doped polysilicon or a metal. The hard mask layer may include silicon nitride.

Thereafter, the first and second impurity regions 307 and 309 may be formed at upper portions of the substrate 300 adjacent to the gate structures 310 through an ion implantation process using an ion implantation mask. The first and second impurity regions 307 and 309 may function as source/drain regions of transistors.

In this way, transistors constituted by the gate structures 310 and the impurity regions 307 and 309 may be formed. Spacers 318 may be formed on sidewalls of the gate structures 310 by using a silicon nitride.

Referring to FIG. 16, a first insulating interlayer 320, a second insulating interlayer 330, a first plug 327, second plugs 329, and third plugs 335 may be formed on the substrate 300.

The first insulating interlayer 320 may be formed on the substrate 300 to cover the gate structures 310 and the spacers 318. First holes (not shown) may be formed in the first insulating interlayer 320 by partially etching the first insulating interlayer 320 so as to expose the first and second impurity regions 307 and 309 through the first holes. In example embodiments, the first holes may be self-aligned with the gate structures 310 and the spacers 318. Thereafter, a first conductive layer may be formed on the first insulating interlayer 320 to fill the first holes, and the upper side of the first conductive layer may be removed through a CMP process and/or an etch-back process until the first insulating interlayer 320 is exposed. Accordingly, the first plug 327 and the second plugs 329 may be formed in the first holes. The first plug 327 may be in contact with the first impurity region 307, and the second plugs 329 may be in contact with the second impurity regions 309. The first conductive layer may include a material such as doped polysilicon or metal. The first plug 327 may function as a bit line contact.

A bit line (not shown) may be formed on the first insulating interlayer 320 by forming a second conductive layer (not shown) making contact with the first plug 327 and patterning the second conductive layer. The second conductive layer may include a material such as doped polysilicon or metal. Thereafter, the second insulating interlayer 330 may be formed on the first insulating interlayer 320 to cover the bit line. The second insulating interlayer 330 may be partially etched to form second holes (not shown) through which the second plugs 329 are exposed. A third conductive layer may be formed on the second insulating interlayer 330 to fill the second holes. The upper side of the third conductive layer may be removed through a CMP process and/or an etch-back process until the second insulating interlayer 330 is exposed, so as to form the third plugs 335. The third conductive layer may include a material such as doped polysilicon or metal. The second and third plugs 329 and 335 may function as capacitor contacts. According to another exemplary embodiment, the second plugs 329 may not be formed, but the third plugs 335 may be formed in a manner such that the third plugs 335 make contact with the second impurity regions 309. For example, the third plugs 335 may function as capacitor contacts.

Referring to FIG. 17, the same processes as those explained with reference to FIGS. 3 to 8 may be performed to form a capacitor on the structure illustrated in FIG. 16.

The capacitor structure may include lower electrodes 380 having curved surfaces on sidewalls thereof and formed on the third plugs 335 penetrating the second insulating interlayer 330. The capacitor structure may include an etch stop layer 345 disposed on a portion of the second insulating interlayer 330 where the lower electrodes 380 are not formed, and a dielectric layer 390 covering the lower electrodes 380, first seeds 374, the etch stop layer 345, and a support layer 350. The capacitor structure may further include an upper electrode 400 disposed on the dielectric layer 390. The first seeds 374 may make contact with the sidewalls of the lower electrodes 380, and second seeds 378 may further be formed between the third plugs 335 and the lower electrodes 380.

Through the above-described processes, a semiconductor device having the gate structures 310 and capacitors may be manufactured.

Figure 18:
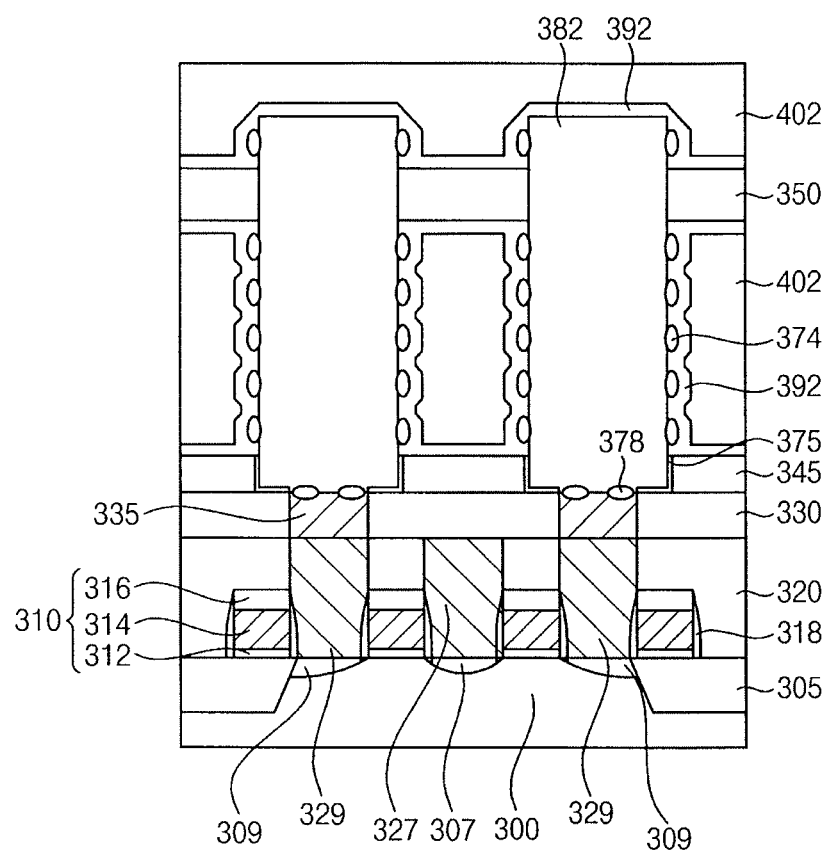
FIG. 18 illustrates a sectional view for explaining a semiconductor device and a method of manufacturing the semiconductor device in accordance with example embodiments.

FIG. 18 illustrates a sectional view for explaining a semiconductor device and a method of manufacturing the semiconductor device in accordance with other example embodiments.

The semiconductor device may include a plurality of gate structures 310 formed on a substrate 300, and capacitors electrically connected to the gate structures 310. A plurality of insulating interlayers may be disposed on the substrate 300 to cover the gate structures 310. The capacitors may be disposed on the insulating interlayers and electrically connected to plugs 329 and 335 formed through the insulating interlayers.

Referring to FIG. 18, the substrate 300, an isolation layer 305, the gate structures 310, and plugs 327, 329, and 335 may be substantially similar to or the same as the substrate 300, the isolation layer 305, the gate structures 310, the insulating interlayers 320 and 330, and the plugs 327, 329, and 335 described with reference to FIG. 14. Thus, descriptions thereof will not be repeated.

Each of the capacitors may include first seeds 374, second seeds 378, a lower electrode 382, and an upper electrode 402. An etch stop layer 345, the first seeds 374, the second seeds 378, the lower electrode 382, a dielectric layer 392, and the upper electrode 402 may be substantially similar to or the same as the etch stop layer 130, the first seeds 174, the second seeds 178, the lower electrode 182, the dielectric layer 192, and the upper electrode 202, respectively, described with reference to FIG. 9. Thus, descriptions thereof will not be repeated.

In the semiconductor device of the example embodiments, each of the capacitor may include the first and second seeds 374 and 378. The lower electrode 382 and the dielectric layer 392 may have sidewalls hemispherically-patterned according to the shapes of the first seeds 374. Thus, the semiconductor device may have satisfactory electrical characteristics.

Referring to FIG. 18, the semiconductor device may be manufactured through processes substantially similar to or the same as those explained with reference to FIGS. 5 to 16 and FIGS. 10 to 13.

By way of summation and review, example embodiments relate to a semiconductor device including a capacitor and a method of manufacturing a semiconductor device including the capacitor. Further, embodiments relate to a capacitor having a high capacitance and a method of forming a capacitor having a high capacitance.

Increasing capacitance by increasing an area of a lower electrode by using a seed has been proposed. However, the lower electrode may make poor contact with a plug when seeds are removed in a later process. Accordingly, exemplary embodiments relate to a sacrificial layer (Si) having an opening formed on a substrate, and the seeds are formed on the inner wall of the opening. Then, a lower electrode is formed on the inner wall of the opening to cover the seeds so that the lower electrode may have surfaces curved according to the shapes of the seeds. As a result, the lower electrode may have a large area.

Further, according to example embodiments, a capacitor may include first and second seeds, and the lower electrode and the dielectric layer may have curved surfaces corresponding to the shapes of the first and second seeds. Thus, the lower electrode and the dielectric layer may have large surface areas as compared with the case where the lower electrode and the dielectric layer have flat surfaces, and thus the capacitance of the capacitor may be increased.

Also, according to the example embodiments, when a lower electrode having a hemispheric pattern is formed using seeds, a process of foaming the seeds may be omitted. Therefore, the seeds may function as a wetting layer or a barrier layer, and the area of the lower electrode may be increased. As a result, a capacitor having a large capacitance may be formed through simple processes, and a semiconductor device including the large-capacitance capacitor may be manufactured.

The foregoing is illustrative of example embodiments and is not to be construed as limiting thereof. Although a few example embodiments have been described, those skilled in the art will readily appreciate that many modifications are possible in the example embodiments without materially departing from the teachings. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A capacitor, comprising:
   a lower electrode having a curved surface;
   a first seed on a sidewall of the lower electrode, the first seed including a metal silicide and having a shape corresponding to the curved surface of the lower electrode;
   a dielectric layer on the lower electrode, the dielectric layer covering the first seed; and
   an upper electrode on the dielectric layer,
   wherein the lower electrode is in contact with a first curved surface of the first seed and the dielectric layer is in contact with a second curved surface of the first seed, the first curved surface being opposite the second curved surface.

2. The capacitor as claimed in claim 1, wherein the first seed has a grain shape.

3. The capacitor as claimed in claim 1, further comprising:

a substrate having the lower electrode thereon;

an insulating interlayer between the substrate and the lower electrode; and a plug extending through the insulating interlayer to electrically connect the substrate and the lower electrode.

4. The capacitor as claimed in claim 3, further comprising a second seed between the plug and the lower electrode, the second seed including a second metal silicide and having a grain shape.

5. The capacitor as claimed in claim 3, further comprising a seed layer pattern between the plug and the lower electrode.

6. A semiconductor device, comprising:

a transistor including a gate structure and an impurity region, the gate structure being on a substrate, the impurity region being at an upper portion of the substrate and being adjacent to the gate structure;

a plug electrically connected to the impurity region through an insulating interlayer, the insulating interlayer being on the substrate and covering the transistor; and a capacitor as claimed in claim 1.

7. The semiconductor device as claimed in claim 6, further comprising a second seed between the plug and the lower electrode, the second seed including a second metal silicide and having a grain shape.

8. A capacitor, comprising:

a lower electrode, a bottom surface and a sidewall of the lower electrode having a plurality of protrusions thereon;

first seeds adjacent to the sidewall of the lower electrode and second seeds adjacent to the bottom surface of the lower electrode, the first and second seeds having a shape corresponding to the protrusions;

a dielectric layer on the lower electrode, the dielectric layer covering the second seeds; and an upper electrode on the lower electrode, wherein the lower electrode is in contact with first curved surfaces of the first seeds and the dielectric layer is in contact with second curved surfaces of the first seeds, the first curved surfaces being opposite the second curved surfaces.

9. The capacitor as claimed in claim 8, wherein the dielectric layer contacts the first seeds, and the dielectric layer is directly between the first seeds and the upper electrode.

10. The capacitor as claimed in claim 8, wherein the dielectric layer has a plurality of second protrusions therein, a shape of the second protrusions corresponding to the shape of the first seeds.

11. The capacitor as claimed in claim 8, wherein the lower electrode, the dielectric layer, and the upper electrode have uneven surfaces based on an arrangement of the first and second seeds.

* * * * *